(12) United States Patent
Illegems

(10) Patent No.: US 7,009,443 B2
(45) Date of Patent: Mar. 7, 2006

(54) METHOD AND CIRCUIT FOR FUSE PROGRAMMING AND ENDPOINT DETECTION

(75) Inventor: Paul F. Illegems, Tucson, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 43 days.

(21) Appl. No.: 10/862,675

(22) Filed: Jun. 7, 2004

(65) Prior Publication Data

US 2005/0270085 A1 Dec. 8, 2005

(51) Int. Cl.
*H01H 85/00* (2006.01)

(52) U.S. Cl. ...................................... 327/525

(58) Field of Classification Search ................. 327/77, 327/87, 89, 525
See application file for complete search history.

(56) References Cited

U.S. PATENT DOCUMENTS

| | | | |
|---|---|---|---|
| 5,264,725 A | | 11/1993 | Mullarkey et al. |
| 5,291,139 A | * | 3/1994 | Fruhauf et al. ............. 324/550 |
| 5,384,727 A | * | 1/1995 | Moyal et al. ................. 365/96 |
| 5,404,049 A | * | 4/1995 | Canada et al. ............. 327/525 |
| 5,708,291 A | | 1/1998 | Bohr et al. |
| 5,731,760 A | * | 3/1998 | Ramirez ..................... 340/638 |
| 6,117,745 A | | 9/2000 | Krishnan |
| 6,166,421 A | | 12/2000 | Kalnitsky et al. |
| 6,208,549 B1 | | 3/2001 | Rao et al. |
| 6,242,790 B1 | | 6/2001 | Tsui et al. |
| 6,268,760 B1 | * | 7/2001 | Marshall et al. ............. 327/525 |
| 6,338,032 B1 | | 1/2002 | Chen |
| 6,384,664 B1 | * | 5/2002 | Hellums et al. ............. 327/525 |
| 6,469,884 B1 | * | 10/2002 | Carpenter et al. .......... 361/111 |
| 6,607,945 B1 | | 8/2003 | Tsui |
| 6,642,601 B1 | | 11/2003 | Marshall et al. |
| 6,653,710 B1 | | 11/2003 | Adkisson et al. |

* cited by examiner

*Primary Examiner*—Jeffrey Zweizig
(74) *Attorney, Agent, or Firm*—Meyertons Hood Kivlin Kowert & Goetzel, P.C.; Jeffrey C. Hood; Mario J. Lewin

(57) ABSTRACT

In one embodiment, a system comprises a programming unit coupled to at least one programmable fuse and configured to program the programmable fuse. In addition, the system comprises a monitoring circuit coupled to the programmable fuse and configured to monitor electrical characteristics associated with the programmable fuse while the programmable fuse is being programmed. In one embodiment, the monitoring circuit is configured to detect a voltage associated with the programmable fuse. Furthermore, the monitoring circuit is configured to compare the detected voltage associated with the programmable fuse with a predetermined voltage value (i.e., endpoint detection). If the detected voltage is equal to or less than the predetermined voltage value, the monitoring circuit is configured to change a state of a control signal to stop the programming of the programmable fuse. Otherwise, the programming unit continues to program the programmable fuse.

35 Claims, 4 Drawing Sheets

METHOD AND CIRCUIT FOR FUSE PROGRAMMING AND ENDPOINT DETECTION

BACKGROUND OF THE INVENTION

1. Field of the Invention

This invention relates to electronic circuits and, more particularly, to programming non-volatile programmable fuses and endpoint detection.

2. Description of the Related Art

Mixed-signal and analog integrated circuits (ICs) may require post-fabrication trimming or calibration to center reference voltages, set oscillator frequency, or adjust other critical parameters within the chip to conform to specifications and meet customer requirements. Several methods exist for trimming ICs, such as programming metal or polysilicon fuses, zapping zener diodes, or programming EPROMs and EEPROMs.

Fuses are two-terminal devices that may be used for trimming ICs. Usually when unprogrammed, a fuse is a low resistive element; but the fuse becomes a high resistive element after "blowing" or programming the fuse to trim a particular IC. In some cases, programming a fuse results in an open circuit. Fuses are typically non-volatile, one-time programmable elements made from materials such as tungsten, nichrome, or polysilicon. Metal fuses usually require larger programming currents than polysilicon fuses; therefore, metal fuses may not be practical for some devices that use thin gate oxides. In these devices, polysilicon fuses or multi-layer polysilicon fuses having a silicide layer may be a solution for the trimming or calibration requirements.

In some applications, silicide polysilicon fuses may be used as on-chip, non-volatile programmable elements. Silicide fuses comprise a polysilicon fuse body and generally a thin layer of titanium silicide ($TiSi_2$), which has a lower resistance than the polysilicon fuse body. Other types of silicide layers may be used, such as tungsten silicide, tantalum silicide, or platinum silicide. Programming of a silicide fuse may be achieved by forcing a current through the fuse to cause the silicide top layer to heat up and eventually melt and agglomerate with the underlying polysilicon fuse body. After programming, the silicide fuse has an increased resistance since the agglomeration of the low resistance silicide layer with the polysilicon body results in a discontinuity in the fuse.

Some fuses may end up completely open after programming, which means that the polysilicon body is completely interrupted. If this occurs, it is possible that structures in the vicinity of the fuse may have been damaged due to the programming of the fuse. For example, cracks in the oxide layers may commonly occur in such instances. This type of damage may be incurred as a result of the various techniques currently used to program fuses. For example, many such techniques over-program the fuse elements.

One mechanical method to overcome this problem and prevent damage to the fuse and surrounding structures from emitted material is to include passivation openings on top of the fuse element. Passivation openings are intended to allow hot material to escape, thereby hopefully preventing damage underneath the fuse. Another mechanical method that may prevent unwanted damage is placing seal ring structures around the fuse. The seal ring structures can be a combination of stacked metal layers to create a wall around a fuse. Both solutions are often combined but these mechanical techniques do not offer a reliable solution to prevent unwanted damage from over-programming fuse elements.

SUMMARY OF THE INVENTION

Various embodiments of a system and method are disclosed for programming fuses and endpoint detection. In one embodiment, a system comprises a programming unit coupled to a plurality of programmable fuses. The programming unit may be configured to program at least one of the programmable fuses. In addition, the system comprises a monitoring circuit coupled to the programmable fuse and configured to monitor electrical characteristics associated with the programmable fuse that is being programmed. Furthermore, in this embodiment, in response to detecting a predetermined electrical characteristic associated with the programmable fuse the monitoring circuit is further configured to stop the programming of the programmable fuse.

In one embodiment, the system comprises a monitoring circuit that is configured to detect a voltage associated with the programmable fuse while the programmable fuse is being programmed. The monitoring circuit is further configured to compare the detected voltage associated with the programmable fuse with a predetermined voltage value (i.e., endpoint detection). If the detected voltage is equal to or less than the predetermined voltage value, the monitoring circuit is configured to change a state of a control signal to stop the programming of the programmable fuse. However, if the detected voltage is greater than the predetermined voltage value, the monitoring circuit is configured to maintain the state of the control signal to continue the programming of the programmable fuse. In this embodiment, the change in the state of the control signal is indicative of the programmed state of the programmable fuse.

Programming a silicide fuse may cause the silicide top layer to heat up and eventually melt and agglomerate with the underlying polysilicon fuse body. After programming, the silicide fuse has an increased resistance; therefore, the programmed state of the fuse may be determined by monitoring the electrical characteristics (e.g., a voltage) associated with the fuse. Damage to the fuse and the surrounding structures may be prevented by stopping the programming of a particular fuse when a specific electrical characteristic associated with the fuse is detected. Also, faster programming of a plurality of fuses may be achieved by simultaneously providing a logic signal that indicates the programmed state of the fuse.

In one embodiment, the programmable fuses may be configured as silicide fuses. However, in other embodiments other types of fuses may be used, for example, metal fuses. In one embodiment, one fuse may be programmed at a time, for example, a fuse may be programmed first and any fuse of the remaining plurality of fuses may be programmed thereafter. However, it is noted that in other embodiments one or more fuses may be programmed simultaneously.

Figure 1:
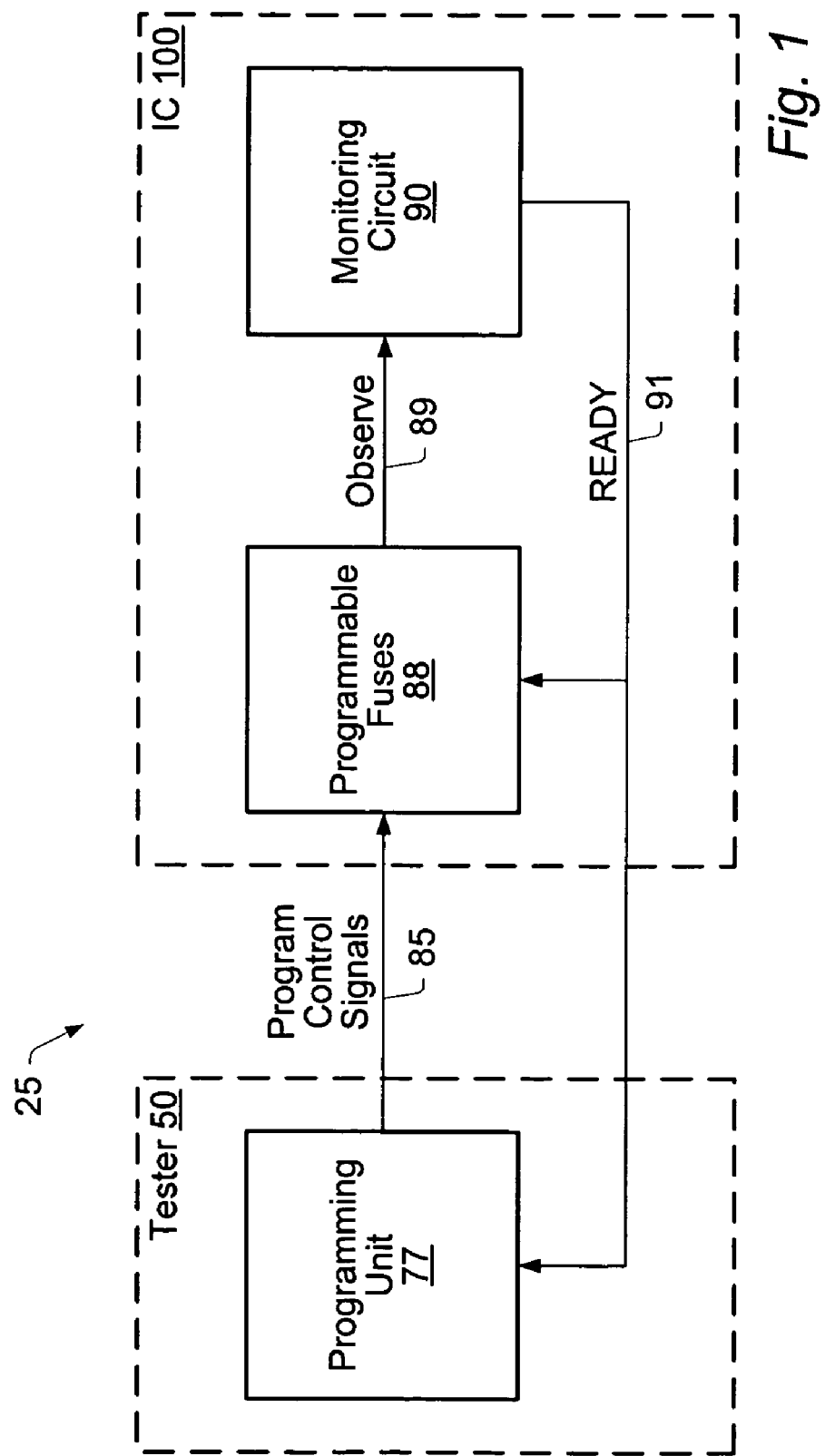
FIG. 1 illustrates a block diagram of one embodiment of a system for programming fuses.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

Turning now to FIG. 1, a block diagram of one embodiment of a system 25 for programming fuses is shown. System 25 may comprise a tester 50, which is coupled to an IC 100 for testing and trimming the IC 100. The tester 50 may comprise a programming unit 77, and the IC 100 may comprise a plurality of programmable fuses 88 and a monitoring circuit 90. It is noted that the programmable fuses 88 and the monitoring circuit 90 may be comprised in any type of integrated circuit, for example, a mixed-signal integrated circuit. It is also noted that in other embodiments the programmable fuses 88 and the monitoring circuit 90 may be comprised in separate integrated circuits.

In one embodiment, programming unit 77 may be operable to program one or more of the plurality of programmable fuses 88 to trim or calibrate the IC 100. System 25 may further comprise a monitoring circuit 90, which may be operable to monitor electrical characteristics associated with a programmable fuse while the programmable fuse is being programmed. In response to detecting a predetermined electrical characteristic associated with the programmable fuse that is being programmed, the monitoring circuit 90 is operable to stop the programming of the programmable fuse. Therefore, in one embodiment, endpoint detection involves detecting the predetermined electrical characteristic associated with the programmable fuse to stop the programming of the programmable fuse. Detecting the programming endpoint may prevent the over-programming of a fuse.

More specifically, in one embodiment, in response to detecting a predetermined electrical characteristic associated with the programmable fuse, e.g., via observe line 89, the monitoring circuit 90 may be operable to change the state of a ready signal 91 to stop the programming of the programmable fuse. Furthermore, the monitoring circuit 90 may be further operable to provide the ready signal 91 to the programming unit 77 to indicate that the programmable fuse has been programmed and to indicate that the programming unit 77 may commence programming another programmable fuse.

The tester 50 may comprise the programming unit 77 for providing one or more programming control signals 85 to program one or more of the plurality of programmable fuses 88 of the IC 100. It is noted however that, in other embodiments, the programming unit 77 may be included in other types of equipment, such as a computer system. The programming unit 77 may be operable to detect the ready signal 91 from the monitoring circuit 90. Depending on the state of the ready signal 91, programming unit 77 may also be operable to continue programming the programmable fuse or to stop programming the programmable fuse and begin programming another programmable fuse. In one embodiment, the tester 50 (or any other type of programming equipment) may be coupled to the IC 100 via a bus, such as a System Management Bus (SMBus), to send the one or more programming control signals 85. It is noted however that, in other embodiments, the tester 50 may be coupled to the IC 100 by any other conductive means, such as another type of system interconnect.

In one embodiment, programming unit 77 and/or monitoring circuit 90 may be implemented in software. In a further embodiment, programming unit 77 and/or monitoring circuit 90 may be implemented in hardware. In yet another embodiment, programming unit 77 and/or monitoring circuit 90 may be implemented in both hardware and software. In one embodiment, the functionality described above with regard to the programming unit 77 and/or monitoring circuit 90 may be distributed across multiple components. In various embodiments, this type of functional distribution may also apply to other components described herein.

It is noted that the embodiment illustrated in FIG. 1 is meant to be exemplary only, and is not intended to limit the methods disclosed herein to any particular application domain. Rather, the techniques described herein are contemplated for use in a wide variety of applications, for example, for programming metal fuses or for zener zapping.

Figure 2:
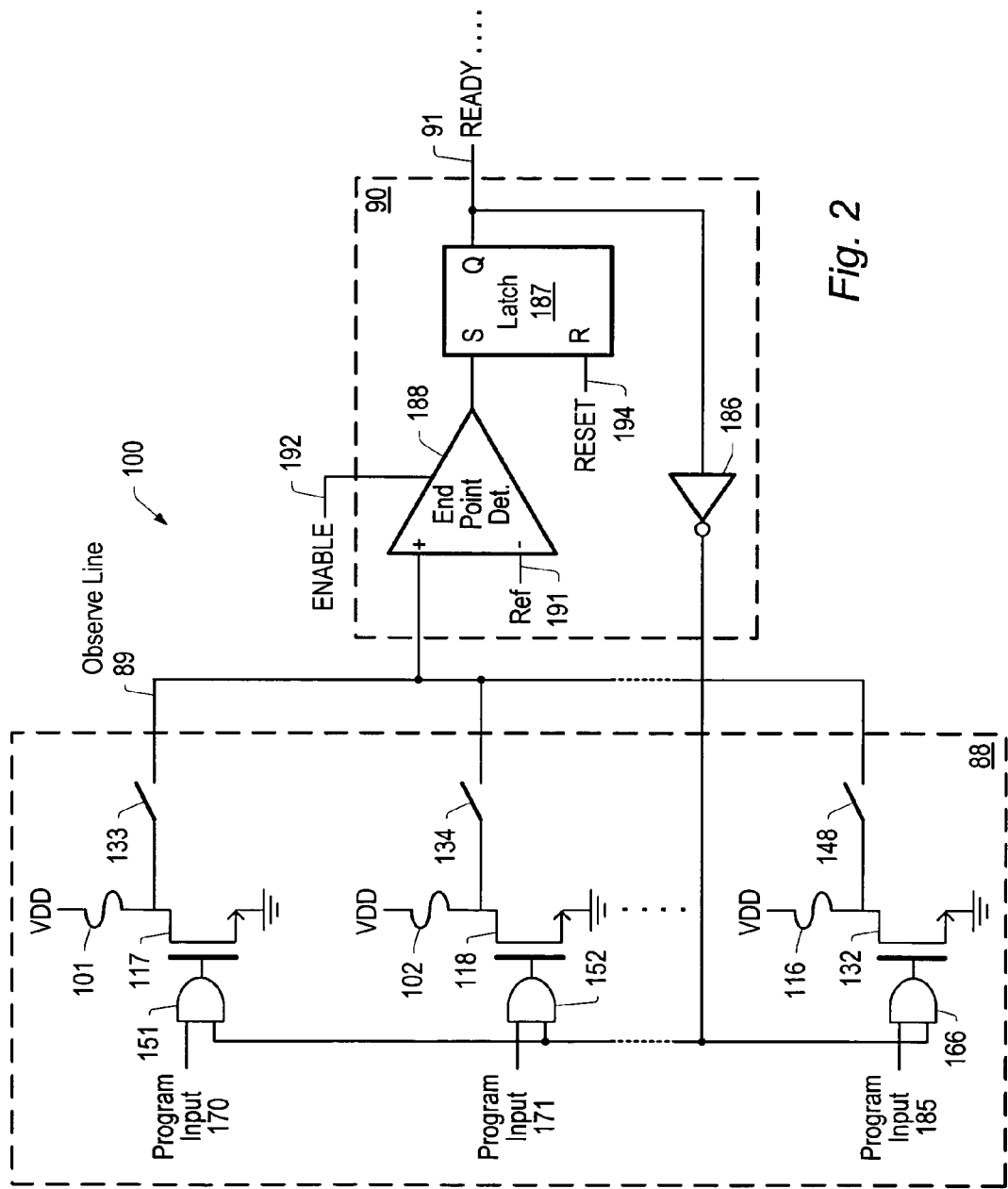
FIG. 2 illustrates a circuit diagram of one embodiment of the monitoring circuit for monitoring electrical characteristics associated with the programmable fuses.

Referring to FIG. 2, a circuit diagram of one embodiment of the monitoring circuit 90 for monitoring electrical characteristics associated with the programmable fuses 88 is shown. In one embodiment, as described above, the IC 100 may comprise a plurality of programmable fuses 88 (e.g., fuses 101–116) coupled to the monitoring circuit 90. More specifically, as illustrated, the IC 100 may comprise the plurality of programmable fuses 101–116 coupled to a plurality of transistors 117–132 and a plurality of switches 133–148. A plurality of logic gates 151–166 may be coupled together and may also be coupled to the plurality of transistors 117–132 and to an inverter 186. In addition, a latch 187 may be coupled to an endpoint detector circuit 188 and to the inverter 186. Furthermore, the endpoint detector 188 may be coupled to the plurality of switches 133–148 via the observe line 89. In one embodiment, the latch 187 may be configured to receive a reset pulse 194 and to output a ready signal 91. Also, the plurality of logic gates 151–166 may be configured to receive a plurality of program inputs 170–185 and the inverse of the ready signal 91. Additionally, the endpoint detector 188 may be configured to receive an enable signal 192.

It should be noted that the components described, for example with reference to FIG. 2, are meant to be exemplary only, and are not intended to limit the invention to any specific set of components or configurations. For example, in various embodiments, one or more of the components described may be omitted, combined, modified, or additional components included, as desired. As will be described in further detail below, in one embodiment, the endpoint detector 188, the latch 187, and the inverter 186 may collectively operate as the monitoring circuit 90. It is noted however that, in other embodiments, monitoring circuit 90 may include alternative or additional components.

In one embodiment, the programmable fuses 101–116 may be configured as silicide fuses. However, it is noted that in other embodiments other types of fuses may be used, for example, metal fuses. In one embodiment, one fuse may be programmed at a time, for example, the fuse 101 may be programmed first and any fuse of the remaining plurality of fuses 102–116 (e.g., fuse 102) may be programmed thereafter. However, it is noted that in other embodiments one or more fuses may be programmed simultaneously.

In one embodiment, as illustrated in FIG. 2, prior to programming a fuse (i.e., fuse 101), the monitoring circuit 90 may be enabled by an enable signal 192. Also, prior to programming the fuse 101, the programming unit 77 (shown in FIG. 1) may send programming control signals 85 to the IC 100 for turning on (i.e., high) the appropriate program input (i.e., program input 170) and for generating a reset pulse 194, which may be applied to latch 187 to initialize the ready signal 91 low.

In one embodiment, the programming control signals 85 may include command and data signals to control the programming of one or more fuses. For example, the programming unit 77 may send a reset command signal to control the generation of the reset pulse 194 to reset the monitoring circuit 90. Also, in this example, the programming unit 77 may send one or more data signals, e.g., binary data 0000 0001, which may be stored in a register (not shown) included within the IC 100, to indicate that the program input 170 should be turned on to program the fuse 101 and the rest of the program inputs 171–185 should be turned off or remain off. In one embodiment, the programming control signals 85 may include binary bit patterns to indicate which fuse is to be programmed. For example, one or more bit patterns may be sent via a bus (e.g., the SMBus), or by any conductive means, to a register (not shown) included within IC 100 and a start command may also be sent. In this example, based on the received bit patterns, the logic of the IC 100 may automatically program one or more of the plurality of fuses.

After the monitoring circuit 90 is reset by the reset pulse 194, the transistor 117 is turned on and a programming current begins to flow through the fuse 101. The transistor 117 is turned on in response to the logic gate 151 receiving the inverse of the low ready signal 91 (i.e., a high input) and the program input 170 (i.e., another high input). Furthermore, when the program input 170 is asserted, the switch corresponding to the fuse 101 (i.e., switch 133) is closed to allow the monitoring circuit 90 to monitor the electrical characteristics of the fuse 101 via the observe line 89. In one embodiment, as described above, one fuse may be programmed at a time; therefore, when the fuse 101 is being programmed, only the transistor 117 out of the plurality of transistors 117–132 may be turned on and only the switch 133 out of the plurality of switches 133–148 may be closed.

As described above, while the fuse 101 is being programmed, the monitoring circuit 90 may be operable to monitor the electrical characteristics of the fuse 101 via the observe line 89. For example, the monitoring circuit 90 may monitor the voltage associated with the fuse 101. In this example, the endpoint detector 188 may be configured to compare the detected voltage associated with the fuse 101 with a predetermined reference voltage value 191. The predetermined reference voltage value 191 may be a specific voltage value that indicates that the fuse (e.g., fuse 101) has been programmed. Therefore, if the detected voltage is above the predetermined reference voltage value 191, it may be indicative that the fuse 101 has not been programmed and the programming of the fuse 101 should continue. However, if the detected voltage is equal to or less than the predetermined reference voltage value 191, it may be indicative that the fuse 101 has been programmed and the programming of the fuse 101 should be stopped.

In one embodiment, if the detected voltage is equal to or less than the reference voltage value 191, the state of the output signal of the endpoint detector 188 may be changed to a high state, which sets the output of the latch 187 (i.e., ready signal 91) high. The high ready signal 91 is subsequently inverted by the inverter 186. In response to receiving the low ready signal 91, the logic gate 151 provides a low signal to turn off the transistor 117, which will effectively cut off the programming current through the fuse 101 to stop the programming of the fuse 101. Furthermore, if the detected voltage associated with the fuse 101 is equal or less than the reference voltage value 191, the programming unit 77 (shown in FIG. 1) may detect the high state of the ready signal 91, which indicates the fuse 101 has been programmed and another fuse may be programmed. In response to detecting that the fuse 101 has been programmed, the programming unit 77 may send programming control signals 85 to IC 100 for turning off (i.e., low) program input 170. Also, if another fuse needs to be programmed (e.g., fuse 102), the programming control signals 85 may turn on the program input 171 and may generate a reset pulse 194, which may be applied to the latch 187 to initialize the ready signal 91 low to begin programming the fuse 102.

In one embodiment, the programming circuit 77 may detect the state of the ready signal 91 by reading a bit in a register (not shown) corresponding to the state of ready signal 91. However, it is noted that in other embodiments the programming circuit 77 may detect the state of the ready signal 91 by other methods, for example, the monitoring circuit 90 may send the ready signal 91 directly to the programming circuit 77.

In an alternative embodiment, the IC 100 illustrated in FIG. 2 may include a plurality of monitoring circuits 90 (not shown). In this alternative embodiment, a plurality of fuses (e.g., fuses 101–116) may be programmed simultaneously. For example, a first monitoring circuit may monitor the electrical characteristics associated with the fuse 101 while the fuse 101 is being programmed, and at the same time, a second monitoring circuit may monitor the electrical characteristics associated with the fuse 105 while the fuse 105 is being programmed.

As described above, programming a silicide fuse may cause the silicide top layer to heat up and eventually melt and agglomerate with the underlying polysilicon fuse body. After programming, the silicide fuse has an increased resistance; therefore, the programmed state of the fuse may be determined by monitoring the electrical characteristics (e.g., a voltage) associated with the fuse.

Figure 3:
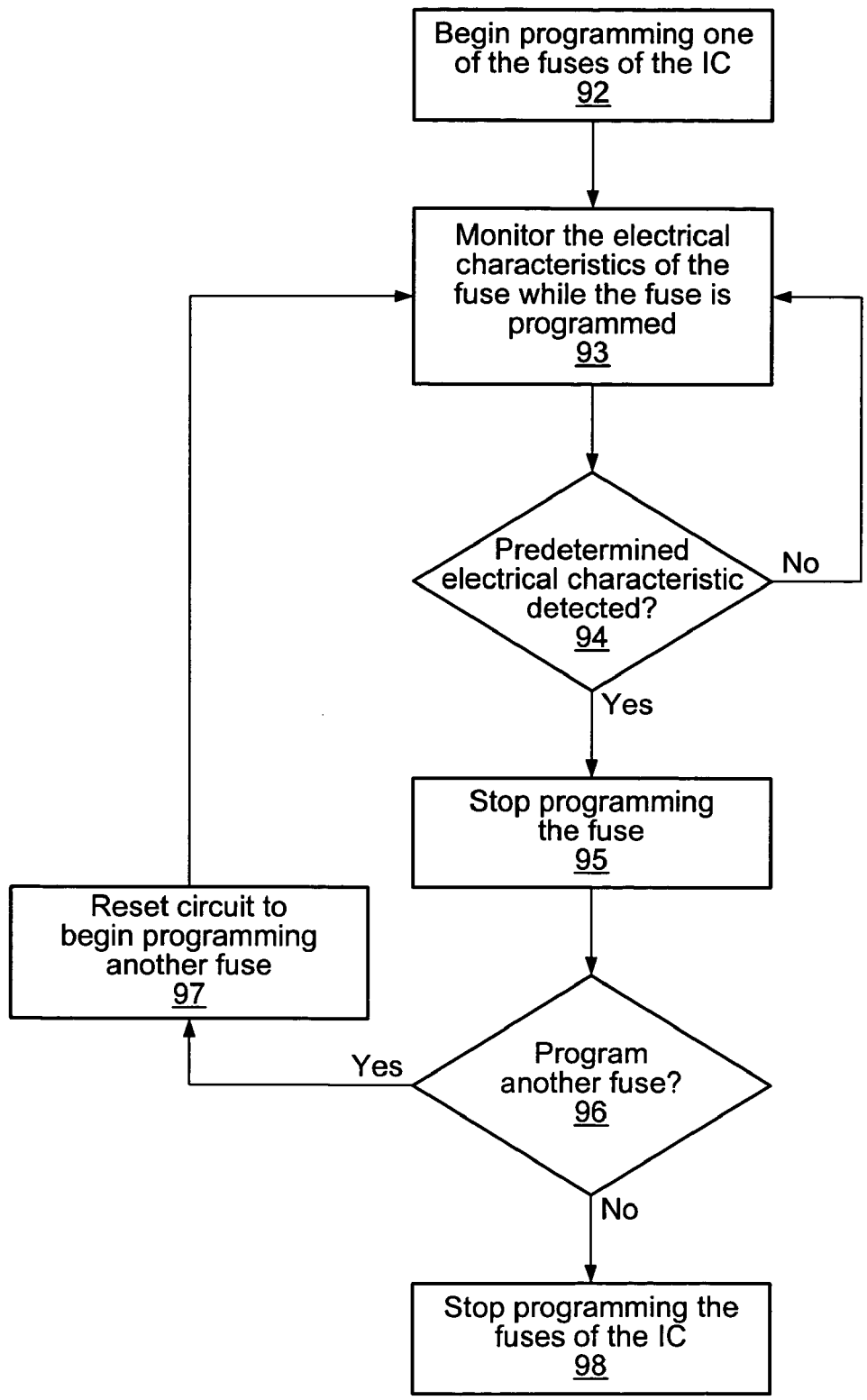
FIG. 3 is a flow diagram illustrating a method for programming one or more of the plurality of fuses.

FIG. 3 is a flow diagram illustrating a method for programming one or more of the plurality of fuses 101–116. It should be noted that in various embodiments, some of the steps shown may be performed concurrently, in a different order than shown, or omitted. Additional steps may also be performed as desired.

Referring collectively to FIGS. 1–3, in one embodiment, the programming unit 77 may begin programming one of the plurality of fuses 101–116 (e.g., fuse 101), as indicated in block 92. The monitoring circuit 90 may be coupled to each of the plurality of programmable fuses 101–116 and configured to monitor the electrical characteristics associated with fuse 101 while the fuse 101 is being programmed, as indicated in block 93. For example, in one embodiment, monitoring circuit 90 may be configured to monitor a voltage associated with fuse 101. The monitoring circuit 90 may be further configured to detect a particular electrical characteristic associated with the fuse 101 (i.e., endpoint detection), which may indicate that the fuse 101 has been programmed, as indicated in block 94. For example, in one embodiment, if the monitoring circuit 90 detects a particular voltage value, then it may indicative that the fuse 101 has been programmed. In response to detecting the particular electrical characteristic associated with the fuse 101 via observe line 89, the monitoring circuit 90 may be operable to change the state of the ready signal 91 to stop programming the fuse 101, as indicated in block 95. However, if the predetermined electrical characteristic is not detected, then the monitoring circuit continues to monitor the electrical characteristics of the fuse 101 while the fuses 101 is being programmed, as indicated in block 93.

In block 96, after fuse 101 has been programmed, the programming unit 77 may determine whether another of the plurality of fuses 101–116 (e.g., fuse 102) should be programmed to calibrate the IC 100. If another fuse (e.g., fuse 102) needs to be programmed, the programming unit 77 resets the monitoring circuit 90 and sends the appropriate programming control signals 85 to begin programming the fuse 102, as indicated in block 97, and the monitoring circuit 90 beings monitoring the fuse 102. However, if all the necessary fuses have been programmed, then the tester 50 stops trimming the IC 100, as indicated in block 98.

Figure 4:
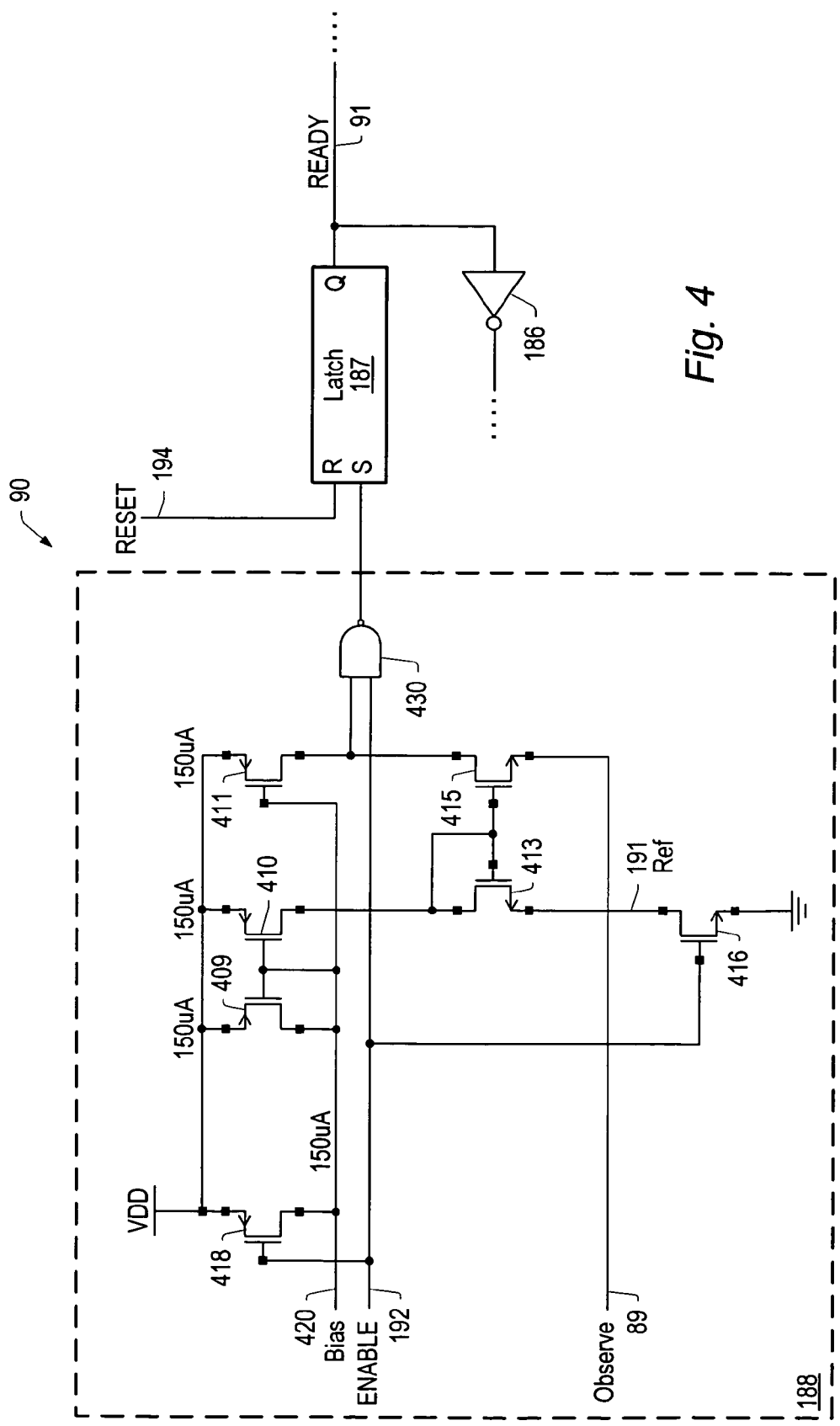
FIG. 4 illustrates a circuit diagram of one embodiment of the endpoint detector for monitoring electrical characteristics associated with the programmable fuses.

FIG. 4 illustrates a circuit diagram of one embodiment of the endpoint detector 188 for monitoring electrical characteristics associated with the programmable fuses. In one embodiment, an enable signal 192 turns on transistor 416 and 418 of endpoint detector 188 and turns on monitoring circuit 90. Also, as described above, to begin programming a fuse, the reset pulse 194 clears the latch 187 and, as a result, the state of the ready signal 91 changes to a low state.

A fixed voltage at the bias input may cause similar currents (e.g., 150 $\mu$A) to flow through the transistor 409 and also through transistors 410 and 411 due to the current mirror. Additionally, the currents will flow through transistors 413 and 415, which are connected as a common gate amplifier. As a result, some voltage will develop at the drain of transistor 416 and the source of transistor 413. In one embodiment, the voltage at the source of transistor 413 (e.g., the reference voltage 191) is compared to the voltage at the observe input 89 (i.e., endpoint detection). When the observe input 89 voltage is higher than the voltage at the source of transistor 413, the drain of transistor 415 will also be high, close to the supply voltage VDD. Since the enable signal 192 is also high, the output of the logic gate 430 will be low and the fuse will continue to be programmed.

When the fuse, which is being programmed, increases in resistance, the observe input 89 voltage will fall. Eventually the observe input 89 voltage will drop below the voltage at the source of transistor 413 (e.g., the reference voltage 191), causing the drain of transistor 415 to also drop to a low voltage, close to the observe input 89 voltage (e.g., 40 mV). Therefore, as a result of the low voltage at the drain of transistor 415, the output of the logic gate 430 (e.g., a NAND gate) will be high and set the latch 187 output (i.e., the ready signal 91) to a high level, which will stop the programming of the fuse, as described above. In one embodiment, the programming current is quickly turned off after the observe input 89 voltage drops below the reference voltage 191 (i.e., voltage at the source of transistor 413 or at the drain of transistor 416). For example, the programming current may be turned off within 25 ns. In one embodiment, the programming current will be turned off when the observe input 89 voltage equals or drops below the reference voltage 191. It is noted however that in other embodiments a variety of methods may be employed in monitoring circuit 90 to turn off the programming current when a particular electrical characteristic associated with the fuse is detected.

It should be noted that the components described, for example with reference to FIG. 4, are meant to be exemplary only, and are not intended to limit the invention to any specific set of components or configurations. For example, in various embodiments, one or more of the components described may be omitted, combined, modified, or additional components included, as desired.

In one embodiment, the supply voltage VDD is a parameter that can be used to set an initial programming current through the programmable fuse. In one embodiment, the resistance of the fuse when the fuse is programmed (i.e., at the programming endpoint) will be relatively independent of the VDD. For example, for a VDD of 2.5 V, the fuse resistance at the programming endpoint may be 1.6 k$\Omega$, and for a VDD of 3.75 V, the fuse resistance at the endpoint may be 1.4 k$\Omega$.

Damage to the fuse and the surrounding structures may be prevented by stopping the programming of a particular fuse when a specific electrical characteristic associated with the fuse is detected. Also, faster programming of a plurality of fuses may be achieved by simultaneously providing a logic signal that indicates the programmed state of the fuse.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An apparatus, comprising:
   a programmable fuse; and
   a monitoring circuit coupled to the programmable fuse and configured to monitor electrical characteristics associated with the programmable fuse while the programmable fuse is being programmed, wherein in response to detecting a predetermined electrical characteristic associated with the programmable fuse the monitoring circuit is operable to stop the programming of the programmable fuse.

2. The apparatus of claim 1, wherein the monitoring circuit is operable to change a state of a control signal coupled between the monitoring circuit and the programmable fuse to stop the programming of the programmable fuse.

3. The apparatus of claim 1, wherein the programmable fuse is configured as a silicide fuse.

4. The apparatus of claim 1, wherein the monitoring circuit is configured to detect a voltage associated with the programmable fuse while the programmable fuse is being programmed.

5. The apparatus of claim 4, wherein the monitoring circuit is configured to compare the detected voltage associated with the programmable fuse with a predetermined voltage value.

6. The apparatus of claim 5, wherein if the detected voltage is equal to or less than the predetermined voltage value the monitoring circuit is configured to change a state of a control signal to stop the programming of the programmable fuse.

7. The apparatus of claim 5, wherein if the detected voltage is greater than the predetermined voltage value the monitoring circuit is configured to maintain a state of a control signal to continue the programming of the programmable fuse.

8. The apparatus of claim 6, wherein the change in the state of the control signal is indicative of the programmed state of the programmable fuse.

9. The apparatus of claim 7, further comprising a plurality of programmable fuses, wherein the plurality of programmable fuse are programmed one at a time, wherein after a first programmable fuse is programmed, the monitoring circuit is reset to begin programming a second programmable fuse, wherein said resetting the monitoring circuit changes the state of the control signal to begin programming the second programmable fuse.

10. A method, comprising:
  programming a programmable fuse;
  monitoring electrical characteristics associated with the programmable fuse while the programmable fuse is being programmed; and
  in response to detecting a predetermined electrical characteristic associated with the programmable fuse, stopping the programming of the programmable fuse.

11. The method of claim 10, wherein said stopping the programming of the programmable fuse comprises changing a state of a control signal to stop the programming of the programmable fuse.

12. The method of claim 10, wherein said monitoring electrical characteristics associated with the programmable fuse comprises detecting a voltage associated with the programmable fuse while the programmable fuse is being programmed.

13. The method of claim 12, wherein said monitoring of electrical characteristics associated with the programmable fuse further comprises comparing the detected voltage associated with the programmable fuse with a predetermined voltage value.

14. The method of claim 13, further comprises changing a state of a control signal to stop the programming of the programmable fuse if the detected voltage is equal to or less than the predetermined voltage value.

15. The method of claim 13, further comprising maintaining a state of a control signal to continue the programming of the programmable fuse if the detected voltage is greater than the predetermined voltage value.

16. The method of claim 14, wherein said changing the state of the control signal is indicative of the programmed state of the programmable fuse.

17. The method of claim 16, further comprising programming a plurality of programmable fuses one at a time, wherein after a first programmable fuse is programmed, a monitoring circuit is reset to begin programming a second programmable fuse, wherein said resetting the monitoring circuit changes the state of the control signal to begin programming the second programmable fuse.

18. A system, comprising:
  a programmable fuse;
  a programming unit coupled to the programmable fuse and configured to program the programmable fuse; and
  a monitoring circuit coupled to the programmable fuse and configured to monitor electrical characteristics associated with the programmable fuse while the programmable fuse is being programmed, wherein in response to detecting a predetermined electrical characteristic associated with the programmable fuse the monitoring circuit is operable to stop the programming of the programmable fuse.

19. The system of claim 18, wherein the monitoring circuit is operable to change a state of a control signal coupled between the monitoring circuit and the programmable fuse to stop the programming of the programmable fuse.

20. The system of claim 18, wherein the monitoring circuit is configured to detect a voltage associated with the programmable fuse while the programmable fuse is being programmed.

21. The system of claim 20, wherein the monitoring circuit is configured to compare the detected voltage associated with the programmable fuse with a predetermined voltage value.

22. The system of claim 21, wherein if the detected voltage is equal to or less than the predetermined voltage value, the monitoring circuit is operable to change a state of a control signal to stop the programming of the programmable fuse.

23. The system of claim 21, wherein if the detected voltage is greater than the predetermined voltage value, the monitoring circuit is operable to maintain a state of a control signal to continue the programming of the programmable fuse.

24. The system of claim 22, wherein the change in the state of the control signal is indicative of the programmed state of the programming element.

25. The system of claim 24, further comprising a plurality of programmable fuses, wherein the plurality of programmable fuses are programmed one at a time, wherein after a first programmable fuse is programmed, the monitoring circuit is reset to begin programming a second programmable fuse, wherein said resetting the monitoring circuit changes the state of the control signal to begin programming the second programmable fuse.

26. The system of claim 18, wherein the programming circuit is comprised in a tester and is configured to provide one or more control signals to cause the programming of the programmable fuse.

27. The system of claim 24, wherein the programming circuit is operable to detect the change in the state of the control signal.

28. The system of claim 27, wherein the programming circuit is further operable to reset the monitoring circuit in response to the change in the state of the control signal.

29. A circuit coupled to a plurality of programmable fuses and configured to monitor programming of the programmable fuses, the monitoring circuit comprising:
  an endpoint detector configured to detect electrical characteristics associated with a programmable fuse while the programmable fuse is being programmed;
  wherein in response to the endpoint detector detecting a predetermined electrical characteristic associated with the programmable fuse, the endpoint detector is operable to stop the programming of the programmable fuse.

30. The circuit of claim 29, wherein the endpoint detector is operable to change a state of a control signal to stop the programming of the programmable fuse.

31. The circuit of claim 29, wherein the endpoint detector is configured to detect a voltage associated with the programmable fuse while the programmable fuse is being programmed.

32. The circuit of claim 31, wherein the endpoint detector is configured to compare the detected voltage associated with the programmable fuse with a predetermined voltage value.

33. The circuit of claim 32, wherein if the detected voltage is equal to or less than the predetermined voltage value, the endpoint detector is configured to change a state of a control signal to stop the programming of the programmable fuse.

34. The circuit of claim 32, wherein if the detected voltage is greater than the predetermined voltage value, the endpoint detector is configured to maintain a state of a control signal to continue the programming of the programmable fuse.

35. The circuit of claim 29, further comprising a latch operable to receive an output of the endpoint detector, wherein the latch is further operable to selectively change a state of a control signal to stop the programming of the programmable fuse depending upon the output received from the endpoint detector.

* * * * *